United States Patent
Vandermeulen et al.

(10) Patent No.: US 6,583,019 B2
(45) Date of Patent: Jun. 24, 2003

(54) PERIMETER ANCHORED THICK FILM PAD

(75) Inventors: Mark Vandermeulen, Burlington (CA); David Roy, Port Colborne (CA)

(73) Assignee: Gennum Corporation (CA)

( * ) Notice: Subject to any disclaimer, the term of this patent is extended or adjusted under 35 U.S.C. 154(b) by 0 days.

(21) Appl. No.: 09/992,678

(22) Filed: Nov. 19, 2001

(65) Prior Publication Data

US 2003/0096493 A1 May 22, 2003

(51) Int. Cl.$^7$ ............................................. H01L 21/20
(52) U.S. Cl. .................. 438/382; 438/383; 438/384; 438/399
(58) Field of Search ................. 438/382–384, 438/399; 257/516, 520, 538

(56) References Cited

U.S. PATENT DOCUMENTS

| | | | | |
|---|---|---|---|---|
| 4,439,814 A | * | 3/1984 | Rhodes | 29/25.42 |
| 4,513,062 A | * | 4/1985 | Suzuki et al. | 428/433 |
| 4,645,552 A | * | 2/1987 | Vitriol et al. | 156/89.16 |
| 4,783,642 A | * | 11/1988 | Takada et al. | 338/306 |
| 4,927,711 A | * | 5/1990 | Francis et al. | 174/255 |
| 4,997,698 A | * | 3/1991 | Oboodi et al. | 427/287 |
| 5,039,552 A | * | 8/1991 | Riemer | 427/117 |
| 5,043,223 A | * | 8/1991 | Kumagai et al. | 174/256 |
| 5,378,313 A | * | 1/1995 | Pace | 216/18 |
| 5,386,087 A | | 1/1995 | Lee et al. | |
| 5,416,782 A | * | 5/1995 | Wells et al. | 714/719 |
| 5,468,919 A | | 11/1995 | Shiozaki et al. | |
| 5,624,782 A | * | 4/1997 | Hayakawa et al. | 427/102 |
| 5,789,142 A | | 8/1998 | Brown | |
| 6,078,505 A | | 6/2000 | Turudic | |
| 6,171,921 B1 | * | 1/2001 | Dunn et al. | 427/101 |
| 6,175,085 B1 | | 1/2001 | Tippner et al. | |
| 6,259,038 B1 | | 7/2001 | Sakaguchi et al. | |
| 2001/0023535 A1 | * | 9/2001 | Dunn | 29/847 |

OTHER PUBLICATIONS

Keusseyan, Roupen & Dilday, John "Barrier Thick Film Approach for the Enhancement of Thermal Cycling Reliability of Soldered Thick Films", ISHM '93 Proceedings, pp. 546–55.1 No month given.

Needes, Christopher and Knaak, Joachim "The Thermal Cycled Adhesion of Thick–Film Copper Conductors", The Dupont Company, IEEE, pp. 618–628. No Date Given.

* cited by examiner

Primary Examiner—Michael S. Lebentritt
(74) Attorney, Agent, or Firm—Jones Day

(57) ABSTRACT

A thick film circuit with a perimeter anchored thick film pad is provided. The thick film circuit includes a base substrate, a thick film bonding pad, and a solder mask layer. The thick film bonding pad is formed on the surface of the base substrate. The solder mask layer is also formed on the surface of the base substrate, and overlaps a portion of the thick film bonding pad in order to improve adhesion between the thick film bonding pad and the base substrate.

21 Claims, 1 Drawing Sheet

PERIMETER ANCHORED THICK FILM PAD

BACKGROUND

1. Field of the Invention

This invention relates generally to the fields of thick film and hybrid circuit fabrication. More particularly, the invention provides a perimeter anchored thick film pad that is especially well suited for use in a hybrid circuit.

2. Description of the Related Art

Hybrid circuits utilizing thick film technology are well known. A thick film circuit is fabricated by patterning conductive, resistive and/or dielectric paste materials onto a ceramic substrate in order to form thick film conductors, and possibly also to form passive circuit components, such as resistors and capacitors. The thick film material generally includes a functional component that determines its electrical properties, a binder component that provides adhesion between the thick film material and the ceramic substrate, and a vehicle to establish printing characteristics. Typically, the thick film paste is patterned on the ceramic substrate, dried to evaporate the solvents from the printed film, and fired in an oven. A hybrid circuit may then be fabricated by soldering conventional electronic components (active or passive) to thick film bonding pads printed on the substrate with conductive thick film materials.

The functional component in conductive thick film materials is typically a fine metal powder, such as copper (Cu), gold (Au), silver (Ag), palladium-silver (PdAg), platinum-silver (PtAg), palladium-gold (PdAu), or platinum-gold (PtAu). Bonding pads and circuit traces are typically patterned from such thick film materials by screen printing the conductive metalic paste onto a ceramic substrate, although other patterning methods are also used, such as spin coating or a combination of screen printing and wet chemical etching. A solder mask layer is then typically added to cover the conductive traces and separate adjacent bonding pads. The solder mask layer is generally screen printed in a pattern onto the ceramic substrate and cured, leaving an area of bare substrate between the solder mask layer and the thick film bonding pads. In this manner, the thick film pads are left entirely uncovered by the solder mask layer, and may be coated with a layer of solder by immersing the entire circuit into a solder bath. Because the solder mask layer typically covers everything but the bonding pads, the pads may be coated with solder without causing solder shorts between adjacent pads and traces. A hybrid circuit may then be formed by aligning the connection terminals of a surface-mount component onto the bonding pads, and reflowing the solder layer to form solder joints between the thick film pads and connection terminals.

As surface-mount components and hybrid circuits are made increasingly smaller and more compact, thick film bonding pads must also be made smaller and positioned at a tighter pitch. Decreasing the size of a thick film bonding pad, however, typically results in less adhesion between the pad and the ceramic substrate. The level of adhesion between the bonding pad and substrate is commonly referred to by those skilled in the art of thick film and hybrid circuit fabrication as peel strength. The peel strength of a thick film bonding pad is typically affected by the size of the pad and by thermal stress induced during the fabrication process. In addition, soldering electronic components to the thick film bonding pads causes additional thermal stress, which further reduces the peel strength, and commonly results in mechanical failure of the bonding pad.

SUMMARY

A thick film circuit with a perimeter anchored thick film pad is provided. The thick film circuit includes a base substrate, a thick film bonding pad, and a solder mask layer. The thick film bonding pad is formed on the surface of the base substrate. The solder mask layer is also formed on the surface of the base substrate, and overlaps a portion of the thick film bonding pad in order to improve adhesion between the thick film bonding pad and the base substrate.

DETAILED DESCRIPTION

Figure 1:
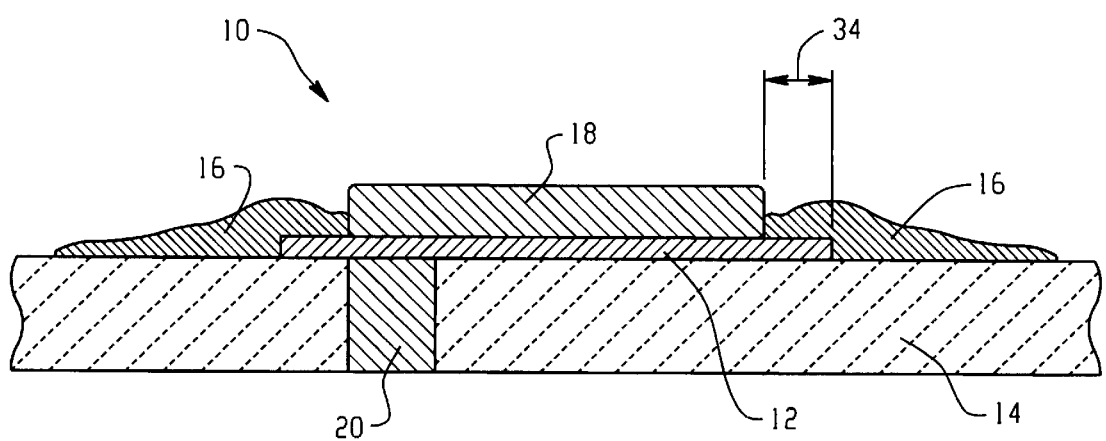
FIG. 1 is a perspective view of a thick film circuit with a perimeter anchored thick film bonding pad.

Referring now to the drawing figures, FIG. 1 is a perspective view of a thick film circuit 10 with a perimeter anchored thick film bonding pad 12. The circuit 10 includes a base ceramic substrate 14, the thick film bonding pad 12, a solder mask layer 16, a solder layer 18, and a filled thru hole 20. The base substrate 14 is preferably composed of alumina ($Al_2O_3$), but may also be composed of other thermally conductive dielectric materials, such as aluminum nitride (AlN) or beryllia (BeO). The thick film bonding pad 12 is preferably a cured thick film metalic paste formed from a copper (Cu) powder, but may also be formed from other conductive materials, such as gold (Au), silver (Ag), palladium-silver (PdAg), platinum-silver (PtAg), palladium-gold (PdAu), or platinum-gold (PtAu). The solder mask layer 18 may be formed from any known solder resist material commonly used by those skilled in the art of thick film and hybrid circuit fabrication. The filled thru hole 20 may be included in order to couple the thick film pad 12 to additional layers of the circuit 10, or possibly to conductive traces or components attached to the other side of the substrate 14.

The thick film bonding pad 12 is preferably printed to the base ceramic substrate 14 and cured by drying and firing the thick film paste. The thick film material may be patterned on the base substrate 14 using known screen printing techniques, or, alternatively, may be patterned using other known methods such as a combination of screen printing and wet chemical etching. Similarly, the solder mask layer 16 is patterned and cured on the base ceramic substrate 14 such that the solder mask layer 16 extends slightly beyond the perimeter of the thick film bonding pad 12. The solder mask layer 16 may be deposited on the base substrate 14 by screen printing a solder resist material onto the base substrate 14 in a pattern that overlaps the edges of the thick film bonding pad 12 as illustrated in both FIGS. 1 and 2. Preferably, the solder mask layer 16 extends around the entire perimeter of the thick film bonding pad 12, such that the interface between the thick film pad 12 and the base substrate 14 is completely covered by solder mask 16. Then, the exposed surface of the thick film bonding pad is preferably coated with a layer of solder 18 in order to enable an electronic component to be soldered to the pad 12 using any known surface mounting technique, such as vapor phase reflow soldering.

The solder layer 18 covering the surface of the thick film bonding pad 12 is typically formed by immersing the entire circuit 10 in a solder bath, but may be formed by other known methods. Immersing the circuit 10 in a solder bath causes solder to adhere to any exposed metalic surfaces. Without a solder mask layer 16 printed between adjacent thick film pads 12 and covering thick film conductive traces, the solder bath would cause shorts to form between the tightly aligned pads 12 and traces on a typical thick film circuit. It is, therefore, important in the fabrication of a fine pitch thick film circuit 10 to ensure that the solder mask layer 16 separates adjacent thick film bonding pads 12. This need for a minimum amount of solder mask 16 between adjacent bonding pads 12 limits the minimum pitch that may be achieved between adjacent thick film bonding pads 12. However, by overlapping the solder mask layer 16 slightly beyond the outer perimeter of the thick film bonding pads 12, the pitch of the thick film circuit 10 may be reduced while maintaining a sufficient amount of solder mask 16 between adjacent bonding pads 12.

In addition, overlapping the solder mask layer 16 onto the thick film bonding pad 12 improves adhesion between the thick film pad 12 and the base substrate 14 for at least two reasons. First, the overlapping solder mask 16 physically anchors the bonding pad 12 to the ceramic substrate 14. Second, the solder mask layer 16 prevents localized access to the interface between the thick film bonding pad 12 and the base ceramic substrate 14, and thus reduces the formation of mechanically weak compounds at this critical interface. In particular, the binder material in a thick film pad 12 (typically oxides and glasses) can combine with solder 18 (typically Pb/Sn) to weakening the bond between the thick film pad 12 and the substrate 14. By extending the solder mask layer 16 over the perimeter of the thick film bonding pad 12, however, the solder layer 18 is isolated from the base substrate 14, and the peel strength of the thick film bonding pad 12 is significantly improved.

Figure 2:
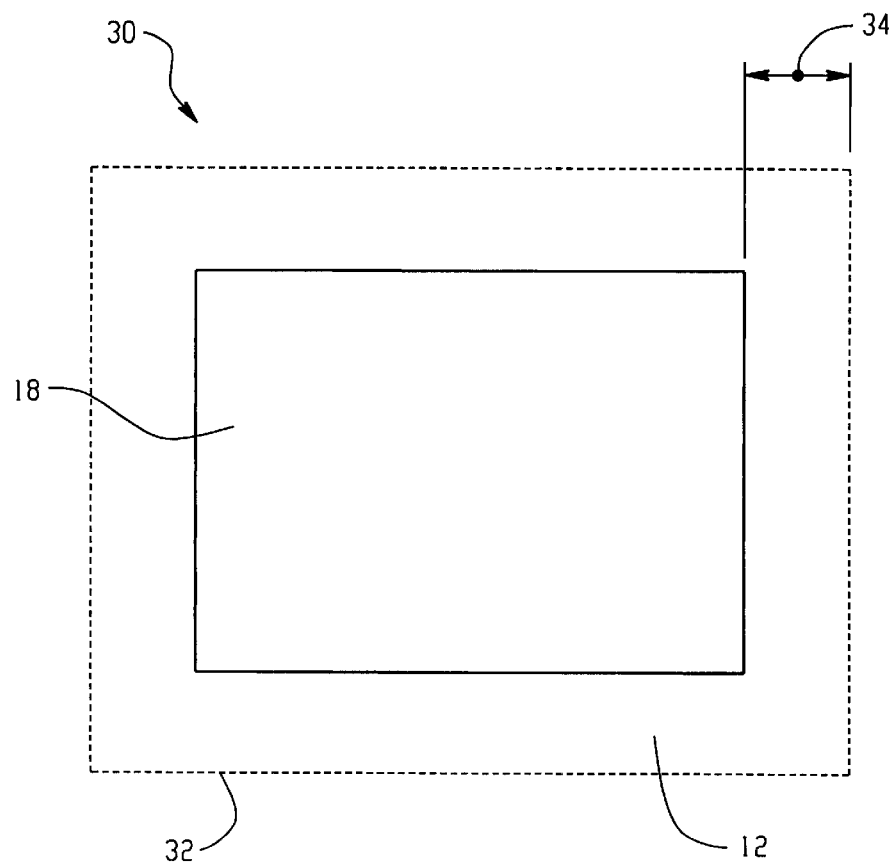
FIG. 2 is a schematic view of the thick film bonding pad shown in FIG. 1.

FIG. 2 is a schematic view 30 of the thick film bonding pad 12 shown in FIG. 1. The schematic view 30 shows the perimeter 32 of the thick film bonding pad 12 as a dotted line, the solder layer 18 as a solid block within the perimeter of the thick film bonding pad 12, and the overlapping solder mask 34 as the area between the solder layer 18 and the perimeter of the thick film bonding pad 12. This schematic view 30 illustrates that the solder mask layer 16 preferably overlaps the thick film pad 12 around its entire perimeter 32. The solder layer 18 is thus preferably isolated in the center of the thick film bonding pad 18. The surface area of the solder layer 18 should be large enough to allow a surface-mount component to be accurately aligned and bonded to the thick film bonding pad 12. The amount of overlap 34 of the solder mask 16 onto to the thick film pad 12 should, therefore, be small enough to retain a sufficiently large surface area for the solder layer 18, but large enough to prevent the solder layer 18 from contacting the edge of the thick film pad 12.

The embodiments described herein are examples of structures, systems or methods having elements corresponding to the elements of the invention recited in the claims. This written description may enable those skilled in the art to make and use embodiments having alternative elements that likewise correspond to the elements of the invention recited in the claims. The intended scope of the invention thus includes other structures, systems or methods that do not differ from the literal language of the claims, and further includes other structures, systems or methods with insubstantial differences from the literal language of the claims.

We claim:

1. A thick film circuit, comprising:
   a base substrate having a surface;
   a thick film bonding pad formed on the surface of the base substrate; and
   a solder mask layer formed on the surface of the base substrate and overlapping a portion of the thick film bonding pad;
   wherein-the base substrate is a ceramic substrate.

2. The thick film circuit of claim 1, wherein the base substrate is comprised of alumina ($Al_2O_3$).

3. The thick film circuit of claim 1, wherein the base substrate is comprised of aluminum nitride (AlN).

4. The thick film circuit of claim 1, wherein the base substrate is comprised of beryllia (BeO).

5. The thick film circuit of claim 1, wherein the base substrate is a glass ceramic substrate.

6. The thick film circuit of claim 1, wherein the base substrate comprises a dielectric thick film layer formed on an alumina ($Al_2O_3$) layer, wherein the thick film bonding pad and solder mask layer are formed on a surface of the dielectric thick film layer.

7. The thick film circuit of claim 1, wherein the thick film bonding pad is comprised of copper (Cu).

8. The thick film circuit of claim 1, wherein the thick film bonding pad is comprised of gold (Au).

9. The thick film circuit of claim 1, wherein the thick film bonding pad is comprised of silver (Ag).

10. The thick film circuit of claim 1, wherein the thick film bonding pad is comprised of palladium-silver (PdAg).

11. The thick film circuit of claim 1, wherein the thick film bonding pad is comprised of platinum-silver (PtAg).

12. The thick film circuit of claim 1, wherein the thick film bonding pad is comprised of palladium-gold (PdAu).

13. The thick film circuit of claim 1, wherein the thick film bonding pad is comprised of platinum-gold (PtAu).

14. The thick film circuit of claim 1, wherein the thick film bonding pad is defined by a perimeter and the solder mask layer overlaps substantially the entire perimeter of the thick film bonding pad.

15. The thick film circuit of claim 14, further comprising:
    a solder layer formed on the thick film bonding pad, wherein the overlapping solder mask layer prevents the solder layer from contacting the interface between the thick film bonding pad and the base substrate.

16. The thick film circuit of claim 15, wherein the solder layer is comprised of a lead-based material.

17. The thick film circuit of claim 15, wherein the solder layer is comprised of a lead-tin alloy (PB/Sn).

18. The thick film circuit of claim 1, wherein the thick film bonding pad is formed on the surface of the base substrate by a combination of thick film screen printing.

19. The thick film circuit of claim 1, wherein the thick film bonding pad is formed on the surface of the base substrate by a combination of thick film screen printing and wet chemical etching.

20. The thick film circuit of claim 1, further comprising:
    a plurality of thick film bonding pads arranged in a land grid array (LGA), wherein the solder mask layer overlaps a portion of each of the thick film bonding pads in order to improve adhesion of the plurality of thick film bonding pads to the base substrate.

21. The thick film circuit of claim 20, wherein one or more electronic components are coupled to the plurality of thick film bonding pads to form a hybrid circuit.

* * * * *